US011884843B2

(12) United States Patent
Mae

(10) Patent No.: US 11,884,843 B2
(45) Date of Patent: Jan. 30, 2024

(54) POLISHING COMPOSITION, POLISHING METHOD, AND METHOD OF PRODUCING SEMICONDUCTOR SUBSTRATE

(71) Applicant: FUJIMI INCORPORATED, Aichi (JP)

(72) Inventor: Ryota Mae, Aichi (JP)

(73) Assignee: FUJIMI INCORPORATED

( * ) Notice: Subject to any disclaimer, the term of this patent is extended or adjusted under 35 U.S.C. 154(b) by 0 days.

(21) Appl. No.: 17/901,412

(22) Filed: Sep. 1, 2022

(65) Prior Publication Data

US 2023/0014626 A1 Jan. 19, 2023

Related U.S. Application Data

(63) Continuation of application No. 17/191,988, filed on Mar. 4, 2021, now abandoned.

(30) Foreign Application Priority Data

Mar. 19, 2020 (JP) ................................ 2020-049621

(51) Int. Cl.

*C09G 1/02* (2006.01)
*H01L 21/3105* (2006.01)
*B24B 7/22* (2006.01)
*C09K 3/14* (2006.01)

(52) U.S. Cl.

CPC ................ *C09G 1/02* (2013.01); *B24B 7/228* (2013.01); *C09K 3/1409* (2013.01); *H01L 21/31053* (2013.01)

(58) Field of Classification Search

None

See application file for complete search history.

(56) References Cited

U.S. PATENT DOCUMENTS 6,251,150 B1 * 6/2001 Small .................. C09K 3/1463 106/3
7,749,322 B2 * 7/2010 Schumacher ........... C01F 7/302 106/484
2002/0194789 A1 * 12/2002 Oshima ............... C09K 3/1463 106/3
2004/0065021 A1 4/2004 Yoneda et al.
2018/0066161 A1 3/2018 Tsuchiya et al.

FOREIGN PATENT DOCUMENTS

CN 112480824 A 3/2021
EP 3792327 A1 3/2021
JP 2001185516 A 7/2001

OTHER PUBLICATIONS

First Office Action in CN 202110291363.5, dated Sep. 26, 2023.

* cited by examiner

*Primary Examiner* — Stephanie P Duclair
(74) *Attorney, Agent, or Firm* — Katten Muchin Rosenman LLP

(57) ABSTRACT

A polishing composition according to the present invention contains abrasive grains, a basic inorganic compound, an anionic water-soluble polymer, and a dispersing medium, in which a zeta potential of the abrasive grains is negative, an aspect ratio of the abrasive grains is 1.1 or less, in a particle size distribution of the abrasive grains obtained by a laser diffraction/scattering method, a ratio D90/D50 of a particle diameter D90 when an integrated particle mass reaches 90% of a total particle mass from a fine particle side to a particle diameter D50 when the integrated particle mass reaches 50% of the total particle mass from the fine particle side is more than 1.3, and the basic inorganic compound is an alkali metal salt.

16 Claims, No Drawings

POLISHING COMPOSITION, POLISHING METHOD, AND METHOD OF PRODUCING SEMICONDUCTOR SUBSTRATE

CROSS-REFERENCE TO RELATED APPLICATION

This application is a continuation application of U.S. patent application Ser. No. 17/191,988, filed on Mar. 4, 2021, which claims the benefit of Japanese Patent Application No. 2020-049621, filed on Mar. 19, 2020, the disclosures of which are incorporated herein by reference in their entirety for all purposes.

BACKGROUND

1. Technical Field

The present invention relates to a polishing composition, a polishing method, and a method of producing a semiconductor substrate.

2. Description of Related Arts

In recent years, a so-called chemical mechanical polishing (CMP) technique for physically polishing and flattening a semiconductor substrate in producing a device has been used in accordance with multilayer wiring on a surface of a semiconductor substrate. The CMP is a method for flattening a surface of an object to be polished (target object) such as a semiconductor substrate by using a polishing composition (slurry) containing abrasive grains such as silica, alumina, or ceria, an anti-corrosion agent, a surfactant, or the like. Specifically, it is used in processes such as shallow trench isolation (STI), flattening of an interlayer dielectric film (ILD film), tungsten plug formation, and formation of a multilayer wiring composed of copper and a low dielectric constant film.

For example, JP 2001-185516 A discloses a polishing composition containing a water-soluble polymer to which alkylene oxide is added, polyacrylic acid, and abrasive grains. According to this technique, it is possible to polish at a high polishing speed and suppress the occurrence of scratches on the polished surface of the object to be polished due to polishing.

SUMMARY

However, it has been found that the technique disclosed in JP 2001-185516 A has a problem in that the improvement of the polishing speed is still insufficient.

Therefore, an object of the present invention is to provide a polishing composition capable of polishing an object to be polished at a high polishing speed.

The present inventor has made extensive studies in order to solve the above problems. As a result, it has been found that the above-mentioned problem can be solved by a polishing composition containing abrasive grains, a basic inorganic compound, an anionic water-soluble polymer, and a dispersing medium, in which a zeta potential of the abrasive grains is negative, an aspect ratio of the abrasive grains is 1.1 or less, in a particle size distribution of the abrasive grains obtained by a laser diffraction/scattering method, a ratio D90/D50 of a particle diameter D90 when an integrated particle mass reaches 90% of a total particle mass from a fine particle side to a particle diameter D50 when the integrated particle mass reaches 50% of the total particle mass from the fine particle side is more than 1.3, and the basic inorganic compound is an alkali metal salt.

DETAILED DESCRIPTION

Hereinafter, embodiments of the present invention will be described; however, the present invention is not limited to the following embodiments. Unless otherwise specified, measurements of operations, physical properties, and the like are performed under the conditions of room temperature (20° C. to 25° C.)/relative humidity 40 to 50% RH. Further, in the present specification, "X to Y" indicating a range means "X or more and Y or less".

<Polishing Composition>

The present invention relates to a polishing composition used for polishing an object to be polished, the polishing composition contains abrasive grains, a basic inorganic compound, an anionic water-soluble polymer, and a dispersing medium, in which a zeta potential of the abrasive grains is negative, an aspect ratio of the abrasive grains is 1.1 or less, in a particle size distribution of the abrasive grains obtained by a laser diffraction/scattering method, a ratio D90/D50 of a particle diameter D90 when an integrated particle mass reaches 90% of a total particle mass from a fine particle side to a particle diameter D50 when the integrated particle mass reaches 50% of the total particle mass from the fine particle side is more than 1.3, and the basic inorganic compound is an alkali metal salt.

The reason why the polishing composition of the present invention exerts the above effect is not always clear, but it is considered as follows.

The polishing composition generally polishes an object to be polished by a physical action of rubbing a surface of a substrate, a chemical action of components other than abrasive grains on the surface of the substrate, and a combination thereof. As a result, the form and type of the abrasive grains have a great influence on the polishing speed.

The polishing composition of the present invention contains abrasive grains having a predetermined shape and a predetermined particle size distribution. That is, the abrasive grains used in the polishing composition are composed of spherical particles that are close to a true sphere because the aspect ratio is 1.1 or less, and further are composed of particles having a wide particle size distribution when D90/D50 is more than 1.3. Since the abrasive grains are the spherical particles that are close to a true sphere, the abrasive grains roll efficiently on a surface to be polished. As a result, the abrasive grains can sufficiently apply a mechanical force to the polished surface while rolling, and can appropriately polish the surface to be polished. Further, since the particle size distribution of the abrasive grains is wide, there are relatively small-sized abrasive grains and relatively large-sized abrasive grains. The abrasive grains having a relatively small size are prevented from rolling on the surface to be polished by coming into contact with the abrasive grains having a relatively large size, and tend to stay on the surface to be polished. When the relatively small size particles staying on the surface to be polished start rolling again due to contact with other particles or the like, a large mechanical force is applied to the surface to be polished for the particle size. As described above, it is presumed that the abrasive grains in which spherical particles that are close to a true sphere have a wide particle size distribution can realize effective polishing at each particle size, and can further increase the polishing speed of the object to be polished. That is, the present invention has found a balance between the aspect ratio of the abrasive grains and the particle size distribution that can effectively act on the surface to be polished.

Further, the abrasive grains contained in the polishing composition of the present invention have a negative zeta (ζ) potential. In other words, the abrasive grains having a negative zeta potential are used in the polishing composition. Here, since the anionic water-soluble polymer contained in the polishing composition of the present invention is a polymer, it easily adheres to the surface of a polishing pad (for example, polyurethane). The zeta potential on the surface of the polishing pad becomes negative due to the adhesion of the anionic water-soluble polymer to the surface of the polishing pad. Specifically, in a case where the zeta potential on the pad surface is positive, the zeta potential on the pad surface becomes negative due to the adhesion of the anionic water-soluble polymer, and in a case where the zeta potential on the pad surface is negative, the adhesion of anionic water-soluble polymer increases the absolute value of the zeta potential thereof. Therefore, when the polishing composition is used to polish the object to be polished, it is presumed that a repulsive force due to negative charges is generated between the polishing pad in contact with the polishing composition and the abrasive grains in the polishing composition, and this repulsion makes it easier for the abrasive grains to act on the surface of the object to be polished, thereby further improving the polishing speed.

Further, the polishing composition of the present invention contains a basic inorganic compound which is an alkali metal salt. For example, a basic inorganic compound tends to increase the electrical conductivity of a polishing composition as compared with the basic organic compound. It is considered that this further improves the polishing speed by the polishing composition. Further, since the basic inorganic compound is an alkali metal salt, it does not have a three-dimensional bulkiness as compared with the basic organic compound, and thereby, the basic inorganic compound and the anionic water-soluble polymer are less likely to form an aggregate. Therefore, in the polishing composition of the present invention, since the anionic water-soluble polymer is in a stable dispersed state, the anionic water-soluble polymer can be efficiently adhered to the polishing pad.

As described above, it is considered that the polishing composition of the present invention has further improved polishing characteristics of the abrasive grains by containing the abrasive grains having a predetermined shape and a predetermined particle size distribution and having high polishing power in combination with an anionic water-soluble polymer and a specific basic inorganic compound. However, it goes without saying that such a mechanism is merely presumption and does not limit the technical scope of the present invention.

[Object to be Polished]

The material contained in the object to be polished by the polishing composition of the present invention is not particularly limited, and examples thereof include silicon oxide, silicon nitride (SiN), silicon carbonitride (SiCN), polycrystalline silicon (polysilicon), amorphous silicon, metal, SiGe, and the like.

The object to be polished according to the present invention preferably contains silicon oxide or silicon nitride, and more preferably contains silicon oxide. Therefore, the polishing composition of the present invention is preferably used for polishing an object to be polished containing silicon oxide or silicon nitride, and more preferably used for polishing an object to be polished containing silicon oxide.

Examples of films containing silicon oxide include a TEOS (Tetraethyl Orthosilicate) type silicon oxide film (hereinafter, also simply referred to as "TEOS film") produced by using tetraethyl orthosilicate as a precursor, and a HDP (High Density Plasma) film, an USG (Undoped Silicate Glass) film, a PSG (Phosphorus Silicate Glass) film, a BPSG (Boron-Phospho Silicate Glass) film, an RTO (Rapid Thermal Oxidation) film, and the like.

[Abrasive Grain]

The polishing composition of the present invention contains abrasive grains. The type of the abrasive grains used in the polishing composition of the present invention is not particularly limited, and examples thereof include oxides such as silica, alumina, zirconia, and titania. The abrasive grains may be used either singly or in combination of two or more types. As the abrasive grains, a commercially available product or a synthetic product may be used. The type of the abrasive grains is preferably alumina. That is, the polishing composition of the present invention contains alumina (preferably alumina obtained by a vaporized metal combustion method described later) as the abrasive grains.

In the polishing composition of the present invention, the abrasive grains exhibit a negative zeta potential, an aspect ratio of the abrasive grains is 1.1 or less, in a particle size distribution of the abrasive grains obtained by a laser diffraction/scattering method, a ratio D90/D50 of a particle diameter D90 when an integrated particle mass reaches 90% of a total particle mass from the fine particle side to a particle diameter D50 when the integrated particle mass reaches 50% of the total particle mass from the fine particle side is more than 1.3.

The abrasive grain used for the polishing composition of the present invention exhibits a negative zeta potential. Here, the "zeta (ζ) potential" is a potential difference that occurs at the interface between a solid and a liquid that are in contact with each other when they perform relative motion. In the polishing composition of the present invention, the polishing speed of the object to be polished can be improved by having the abrasive grains with a negative charge. The zeta potential of the abrasive grains is preferably −80 mV or more and −5 mV or less, and more preferably −60 mV or more and −20 mV or less. When the abrasive grains (alumina) have a zeta potential in such a range, the polishing speed for the object to be polished can be further improved.

The zeta potential of the abrasive grain in the polishing composition is calculated by putting the polishing composition in ELS-Z2 manufactured by Otsuka Electronics Co., Ltd., to perform a measurement at temperature 25° C. using a flow cell by a laser Doppler method (electrophoretic light scattering measurement method), and then analyzing the obtained data by a Smoluchowski equation.

The aspect ratio of the abrasive grains used in the polishing composition of the present invention is 1.1 or less. By using the abrasive grains having an aspect ratio of 1.1 or less, the abrasive grains roll effectively on the surface to be polished, which improves the polishing speed. In the polishing composition of the present invention, when the aspect ratio of the abrasive grains is more than 1.1, many abrasive grains may stay on the surface to be polished, and many remaining abrasive grains may cause overpolishing. The aspect ratio of the abrasive grains is preferably less than 1.1, more preferably 1.09 or less, and still more preferably 1.08 or less. Within such a range, the polishing speed can be more improved. It is presumed that spherical particles that are close to a true sphere are less likely to be deformed or broken due to deformation when stress is applied, and can transmit larger stress to the object to be polished. Since the aspect ratio of the abrasive grains is 1 in a case of the true sphere, the lower limit thereof is 1 or more. The aspect ratio of the abrasive grains is an average value obtained by taking the smallest rectangle circumscribing the image of an abrasive particle with a scanning electron microscope and dividing the length of a long side of the rectangle by the length of a short side of the same rectangle, and can be determined using general image analysis software. Specifically, the aspect ratio is calculated from an equation "average major axis/average minor axis" after by randomly selecting 100 abrasive grains from the images measured by a scanning electron microscope (SEM) (product name: SU8000 manufactured by Hitachi High-Technology Co., Ltd.) and measuring and calculating their average major axis and average minor axis. Details of the method for measuring and calculating the aspect ratio of the abrasive grains will be described in examples.

In the abrasive grains used in the polishing composition of the present invention, in a particle size distribution obtained by a laser diffraction/scattering method, a ratio D90/D50 of a particle diameter D90 when an integrated particle mass reaches 90% of a total particle mass from the fine particle side to a particle diameter D50 when the integrated particle mass reaches 50% of the total particle mass from the fine particle side is more than 1.3. As a result, in the polishing composition, there are relatively small-sized abrasive grains and relatively large-sized abrasive grains. The abrasive grains having a relatively small size are prevented from rolling on the surface to be polished by coming into contact with the abrasive grains having a relatively large size. As a result, the relatively small size of the abrasive grains can sufficiently apply a mechanical force to the object to be polished during the polishing, and the polishing speed of the object to be polished can be further improved. In a case where the D90/D50 is 5.0 or less, the polishing speed will decrease.

D90/D50 is preferably 1.5 or more, more preferably 1.8 or more, still more preferably 2.0 or more, and particularly preferably 2.5 or more. Within such a range, the polishing speed can be more improved. In the particle size distribution of the abrasive grain in the polishing composition, which is obtained by the laser diffraction scattering method, the upper limit of D90/D50 which is a ratio of a particle diameter (D90) when the integrated particle mass reaches 90% of the total particle mass from the fine particle side to a particle diameter (D50) when the integrated particle mass reaches 50% of the total particle mass from the fine particle side is not particularly limited, and it is preferably 4.0 or less, and is more preferably 3.5 or less. Within such a range, defects such as scratches, which may be generated, can be suppressed on the surface of the object to be polished after polishing using the polishing composition.

A size of the abrasive grain is not particularly limited, but a lower limit of an average primary particle size of the abrasive grains obtained by image analysis from the observation photograph of the scanning electron microscope is preferably 10 nm or more, more preferably 25 nm or more, and still more preferably 50 nm or more. In addition, in the polishing composition of the present invention, the upper limit of the average primary particle size of the abrasive grains is preferably 500 nm or less, more preferably 250 nm or less, and still more preferably 200 nm or less. Within such a range, defects such as scratches, which may be generated, can be suppressed on the surface of the object to be polished after polishing using the polishing composition. That is, the average primary particle size of abrasive grains is preferably 10 nm or more and 500 nm or less, more preferably 25 nm or more and 250 nm or less, and further preferably 50 nm or more and 200 nm or less. The average primary particle size of the abrasive grains is calculated based on, for example, the specific surface area of the abrasive grain measured by a BET method.

In the polishing composition of the present invention, the lower limit of an average secondary particle size of the abrasive grains is preferably 30 nm or more, more preferably 80 nm or more, still more preferably 100 nm or more, and even more preferably 150 nm or more. In addition, in the polishing composition of the present invention, the upper limit of the average secondary particle size of the abrasive grains is preferably 1000 nm or less, more preferably 500 nm or less, still more preferably 400 nm or less, and particularly preferably 350 nm or less. Within such a range, defects such as scratches, which may be generated, can be suppressed on the surface of the object to be polished after polishing using the polishing composition. That is, the average secondary particle size of abrasive grains is preferably 30 nm or more and 1000 nm or less, more preferably 80 nm or more and 500 nm or less, still more preferably 100 nm or more and 400 nm or less, and particularly preferably 150 nm or more and 350 nm or less. Note that, the average secondary particle size of the abrasive grains can be measured, for example, by a dynamic light scattering method represented by a laser diffraction scattering method. That is, the average secondary particle size of the abrasive grains corresponds to the particle diameter D50 when the integrated particle mass reaches 50% of the total particle mass from the fine particle side, in a particle size distribution of the abrasive grains obtained by a laser diffraction/scattering method.

An average association degree of the abrasive grains is preferably 4.0 or lower, more preferably 3.0 or lower, and still more preferably 2.5 or lower. As the average association degree of the abrasive grains is decreased, the generation of defects on the surface of the object to be polished can be further reduced. In addition, the average association degree of the abrasive grains is preferably 1.5 or higher, and is more preferably 1.8 or higher. As the average association degree of the abrasive grains is increased, there is an advantage in that the polishing speed by the polishing composition is improved. Note that, the average association degree of the abrasive grains can be obtained by dividing the value of the average secondary particle size of the abrasive grains by the value of the average primary particle size.

The size of the abrasive grain (average particle size, aspect ratio, D90/D50, and the like) can be appropriately controlled by the selection and the like of the method for producing the abrasive grains.

The abrasive grains used in the present invention preferably have a fracture strength of 0.5 GPa or more. The fracture strength of the abrasive grains is not particularly limited as long as it is 0.5 GPa or more, and is preferably 0.6 GPa or more, more preferably 0.65 GPa or more, still more preferably 0.7 GPa or more, even more preferably 0.75 GPa or more, and is particularly preferably 0.8 Pa or more. Within the above range, the polishing speed is further improved. The fracture strength of alumina is preferably 2 GPa or less. Within the above range, the production suitability is further improved while maintaining a high polishing speed.

The fracture strength of the abrasive grains can be calculated with reference to "Rapid Determination of the Tensile Strength of Rocks with Irregular Test Pieces, HIRAMATSU Yoshio, OKA Yukitoshi, KIYAMA Hideo, Journal of the Mining and Metallurgical Institute of Japan, Vol. 81, No. 932, 1024-1030, 1965". Specifically, when particles (particularly spherical particles) are compressed, compressive stress is distributed near a loading point, but tensile stress is distributed almost all over the other parts. Therefore, the fracture strength of alumina can be calculated according to the following equation by recording the obtained load-push displacement diagram and assuming that the point where the displacement increases rapidly is a point where large-scale fracture occurs in the particles.

$$S_t=(2.8\times P)/(\pi\times d^2) \quad \text{[Equation 1]}$$

in the equation, $S_t$ represents a fracture strength [GPa],

P represents a fracture load [kgf], and d represents an average particle size [μm] of particles.

Here, a fracture load P can be measured using a micro-compression tester MCTW-500 manufactured by Shimadzu Corporation and a flat surface indenter made of diamond (φ=50 μm). Further, the method for measuring an average particle size d will be described later in the description of the average particle size. Details of the method for measuring and calculating the fracture strength of alumina will be described in examples.

Note that, the fracture strength of the abrasive grains calculated based on the above measurement is the same value even if the measurement is performed in a state of a raw material (for example, powdered alumina) of the polishing composition or the abrasive grains (for example, alumina) are taken out from the prepared polishing composition and measured.

When alumina is used as the abrasive grains, it can be appropriately selected from various known alumina to be used. Examples of known alumina include alumina containing at least one selected from α-alumina, γ-alumina, δ-alumina, θ-alumina, η-alumina, and κ-alumina, for example. Further, alumina called fumed alumina (typically, alumina fine particles produced when an alumina salt is fired at a high temperature) may be used based on the classification according to the production method. Further, alumina called colloidal alumina or alumina sol (for example, alumina hydrate such as boehmite) is also included in the above-mentioned examples of known alumina. The alumina used as the abrasive grains of the polishing composition of the present invention may contain one kind of such alumina alone or in combination of two or more kinds. Among these, alumina containing a γ phase (alumina containing γ-alumina) is preferable as a crystal phase, and alumina containing a γ phase (alumina containing γ-alumina as a main component) is more preferably as a main crystal phase.

In the present specification, in a case where the peak of the γ phase appearing at a position of 2θ=46° is confirmed from the powder X-ray diffraction spectrum obtained by using the powder X-ray diffractometer, the alumina "contains the γ phase as the crystal phase". Further, in the present specification, in a case where an austenitizing rate described later is more than 50%, it is determined that alumina "contains the γ phase as the main crystal phase" (upper limit 100%). By using alumina containing a γ phase as the crystal phase, the polishing speed is further improved, and when the γ phase is the main crystal phase, the effect is further enhanced. It is presumed that the γ phase has a large amount of deformability when the stress is applied and contributes to the improvement of the fracture strength. The alumina produced by the vaporized metal combustion method described later tends to have a particularly high γ-phase content when a γ-phase peak appearing at the position of 2θ=46° is confirmed.

In addition, a pregelatinization rate of alumina is preferably less than 50%, more preferably less than 45%, and still more preferably less than 40% (lower limit 0%). Within the above range, the polishing speed is further improved. It is presumed that although an a phase has high hardness, it tends to be brittle, and thus the fracture strength at the time of applying the stress contributes to further improvement by keeping the content below a certain level. Here, a pregelatinization rate [%] can be calculated by the following equation, from a peak height (I25.6) of an a phase (012) plane appearing at the position of 2θ=25.6° and a peak height (I46) of a γ phase appearing at the position of 2θ=46° in a powder X-ray diffraction spectrum obtained by using a powder X-ray diffractometer.

$$\text{Pregelatinization rate}=I25.6/(I25.6+I46)\times 100\ \text{[unit: \%]} \quad \text{[Equation 2]}$$

In the case where the γ phase is contained as the main crystal phase, it is preferable to further contain the α phase as the crystal phase. In this case, the hardness is further improved and the polishing speed is further improved. At this time, the pregelatinization rate is preferably more than 0% and less than 40%.

Further, in the present specification, the austenitizing rate [%] is defined as a value calculated by the following equation, from a peak height (I25.6) of an a phase (012) plane appearing at the position of 2θ=25.6° and a peak height (I46) of a γ phase appearing at the position of 2θ=46° in a powder X-ray diffraction spectrum obtained by using a powder X-ray diffractometer.

$$\text{Austenitizing rate}=I46/(I25.6+146)\times 100\text{[unit:\%]} \quad \text{[Equation 3]}$$

The type of the crystal phase in alumina and the content ratio thereof can be controlled by a production method and production conditions. For example, alumina produced by the vaporized metal combustion method described later has a higher austenitizing rate and a lower pregelatinization rate. Further, in the vaporized metal combustion method, the pregelatinization rate can be lowered by lowering the heating temperature after the vaporized metal combustion reaction to 1225° C.

Details of the identification of the type of the crystal phase in alumina, the measurement of the pregelatinization rate and the austenitizing rate, the measurement of the calculation method, and the calculation method will be described in examples.

In addition, the pregelatinization rate and the austenitizing rate calculated based on the above measurement is the same value even if the measurement is performed in a state where powdered alumina which is a raw material of the polishing composition or alumina is taken out from the prepared polishing composition and measured.

The method for producing alumina used in the present invention is not particularly limited, and a known method can be appropriately used. Among these, the method for producing alumina by the VMC method: vaporized metal combustion method is preferable because alumina having an aspect ratio of 1.1 or less can be obtained. That is, the alumina is preferably alumina produced by the vaporized metal combustion method. By adopting the vaporized metal combustion method, alumina having an aspect ratio of 1.1 or less can be obtained, and the polishing speed is further improved by using the particles. Further, the alumina obtained by the vaporized metal combustion method has a high fracture strength (for example, a fracture strength of 0.5 GPa or more). In the present invention, since the polishing speed is further improved by using the abrasive grains having high fracture strength, it is preferable to produce alumina by the vaporized metal combustion method from the viewpoint of the fracture strength.

The vaporized metal combustion method means "a method of: forming a chemical flame in an atmosphere containing oxygen; charging into the chemical flame such an amount of a metallic powder which constitutes a part of oxide particles of interest that a dust cloud is formed; and causing deflagration to obtain the oxide particles." Details of the vaporized metal combustion method are described in known documents such as JP 60-255602 A, and alumina can be produced with reference to these descriptions. Further, in the vaporized metal combustion method, in the vaporized metal combustion reaction, the value of the fracture strength can be increased by pretreating the powder fluid of the metal alumina as the pre-raw material at the heating temperature of more than 1200° C. Further, for ease of control, the heating temperature in the vaporized metal combustion reaction is preferably between 1250° C. and 1275° C. In the vaporized metal combustion method, the aspect ratio can be approached to 1 by lowering the heating temperature after the vaporized metal combustion reaction below 1225° C. In the heat treatment, a known apparatus/method such as a rotary kiln can be adopted.

A lower limit of the content (concentration) of the abrasive grains in the polishing composition of the present invention is preferably 0.2% by mass or more, more preferably 0.3% by mass or more, and is still more preferably 0.5% by mass or more, based on the polishing composition. Further, the upper limit of the content of the abrasive grains in the polishing composition of the present invention is preferably 20% by mass or less, more preferably 15% by mass or less, still more preferably 10% by mass or less, and even more preferably 5% by mass or less, based on the polishing composition.

Within such a range, the polishing speed can be more improved. Note that, in a case where the polishing composition contains two or more types of abrasive grains, the content of the abrasive grains is intended to be the total amount of these.

[Basic Inorganic Compounds]

The polishing composition of the present invention contains a basic inorganic compound which is an alkali metal salt. Here, the basic inorganic compound refers to an inorganic compound having a function of raising a pH of the composition by being added to the polishing composition. The basic inorganic compound has a function of chemically polishing the surface of the object to be polished and a function of improving the dispersion stability of the polishing composition. Further, the basic inorganic compound contained in the polishing composition of the present invention tends to increase the electrical conductivity of a polishing composition as compared with the basic organic compound. It is considered that this further improves the polishing speed by the polishing composition.

Further, the basic inorganic compound which is an alkali metal salt does not have a three-dimensional bulkiness as compared with the basic organic compound, and thereby, the basic inorganic compound and the anionic water-soluble polymer are less likely to form an aggregate. Therefore, in the polishing composition of the present invention, since the anionic water-soluble polymer is in a stable dispersed state, the anionic water-soluble polymer can be efficiently adhered to the polishing pad.

Examples of the basic inorganic compound which is an alkali metal salt include lithium hydroxide, lithium carbonate, potassium hydroxide, potassium carbonate, potassium hydrogen carbonate, tripotassium phosphate, dipotassium hydrogen phosphate, sodium hydroxide, sodium carbonate, sodium hydrogen carbonate, trisodium phosphate, disodium hydrogen phosphate, and the like. Among these, as the basic inorganic compound of the alkali metal salt, potassium hydroxide and sodium hydroxide are preferable, and potassium hydroxide is more preferable, from the viewpoint of pH and stability of the slurry.

In the embodiment of the present invention, the content of the basic inorganic compound in the polishing composition is preferably 0.001% by mass or more, more preferably 0.01% by mass or more, still more preferably 0.05% by mass or more, and particularly preferably 0.1% by mass or more, based on the polishing composition. With such a lower limit, the polishing speed is further improved. The content of the basic inorganic compound in the polishing composition is preferably 10% by mass or more, more preferably 8% by mass or more, and still more preferably 5% by mass or more, based on the polishing composition. With such an upper limit, a stable slurry without agglomeration can be obtained.

[Anionic Water-Soluble Polymer]

The polishing composition of the present invention contains an anionic water-soluble polymer. The anionic water-soluble polymer is a water-soluble polymer having an anionic group in the molecule. In the present specification, "water-soluble" means that the solubility in water (25° C.) is 1 g/100 mL or more. The anionic water-soluble polymer may be used alone or in combination of two or more.

When the polishing composition of the present invention is used to polish the object to be polished, the anionic water-soluble polymer contained in the polishing composition adheres to a polishing pad. At this time, in a case where the zeta potential on the pad surface is positive, the zeta potential becomes negative due to the adhesion of the anionic water-soluble polymer, and in a case where the zeta potential on the pad surface is negative, the adhesion of anionic water-soluble polymer increases the absolute value of the zeta potential thereof. For example, when the polishing pad is polyurethane, the zeta potential on the surface of the polyurethane is about −45 mV, but when the polishing pad comes into contact with the polishing composition of the present invention (that is, an anionic water-soluble polymer adheres), the zeta potential on the surface of the polishing pad can be increased to −80 mV. Therefore, the anionic water-soluble polymer adheres to the surface of the polishing pad to make the surface charge of the polishing pad negative, or increasing the absolute value of the negative surface charge of the polishing pad guides the polishing pad and the abrasive grains to repel more, which improves the polishing speed.

According to the embodiment of the present invention, as the anionic water-soluble polymer, those containing at least one functional group selected from the group consisting of a carboxyl group, a sulfo group, a phosphoric acid group, and a phosphonic acid group in the molecule are preferable. Among them, the anionic water-soluble polymer preferably contains a carboxyl group. By containing such a group in the anionic water-soluble polymer, the desired effect of the present invention can be efficiently exerted.

Further, according to the embodiment of the present invention, it is preferable that the anionic water-soluble polymer has a constituent unit derived from a monomer having an ethylenically unsaturated bond. For example, the anionic water-soluble polymer preferably contains at least one selected from the group consisting of acrylic acid and methacrylic acid as a constituent unit derived from the monomer. Therefore, it is more preferable that the anionic water-soluble polymer is at least one selected from the group consisting of a polyacrylic acid-based polymer and a polymethacrylic acid-based polymer. According to such an embodiment, it is presumed that a carboxyl group interacts with the basic inorganic compound in the polishing composition, and the abrasive grains are stably dispersed.

The anionic water-soluble polymer may be a copolymer containing a constituent unit derived from a monomer having an ethylenically unsaturated bond in one molecule and a constituent unit derived from another monomer. Examples of such a copolymer include a copolymer of (meth)acrylic acid and vinyl alcohol, a copolymer of (meth) acrylic acid and 2-hydroxy-2-phosphonoacetic acid (HPAA), a copolymer of (meth)acrylic acid and acrylic morpholine (ACMO), and the like. Note that, the term of (meth)acrylic acid comprehensively refers to acrylic acid and methacrylic acid.

Further, the anionic water-soluble polymer may contain an oxyalkylene unit. Examples of the oxyalkylene unit that can be contained in the anionic water-soluble polymer include polyethylene oxide (PEO), a block copolymer of ethylene oxide (EO) and propylene oxide (PO), a random copolymer of EO and PO, and the like. The block copolymer of EO and PO may be a diblock body containing a polyethylene oxide (PEO) block and a polypropylene oxide (PPO) block, a triblock body, and the like. The triblock body includes a PEO-PPO-PEO type triblock body and a PPO-PEO-PPO type triblock body.

In the embodiment of the present invention, the lower limit of the molecular weight (mass average molecular weight) of the anionic water-soluble polymer is preferably 1,000 or more, 5,000 or more, 10,000 or more, 50,000 or more, 100,000 or more, 300,000 or more, 500,000 or more, and 800,000 or more in this order. The upper limit of the molecular weight (mass average molecular weight) of the anionic water-soluble polymer is preferably 8,500,000 or less, 6,000,000 or less, 4,000,000 or less, 2,000,000 or less, and 1,500,000 or less in this order. That is, the molecular weight (mass average molecular weight) of the anionic water-soluble polymer is, for example, preferably 1,000 or more and 8,500,000 or less, 5,000 or more and 6,000,000 or less, 10,000 or more and 4,000,000 or less, 50,000 or more and 4,000,000 or less, and 100,000 or more and 2,000,000 or less in this order. Within such a range, the polishing speed can be more improved. As the molecular weight (mass average molecular weight) of the anionic water-soluble polymer, a value measured by the GPC method can be adopted.

In the embodiment of the present invention, the content of the anionic water-soluble polymer in the polishing composition is preferably 0.001% by mass or more, more preferably 0.005% by mass or more, still more preferably 0.01% by mass or more, and even more preferably 0.05% by mass or more, and most preferably 0.08% by mass or more, based on the polishing composition In addition, the content of the anionic water-soluble polymer in the polishing composition is 0.8% by mass or less, more preferably 0.5% by mass or less, and particularly preferably 0.4% by mass, based on the polishing composition. Within such a range, a high polishing speed can be maintained. Note that, when the polishing composition contains two or more kinds of anionic water-soluble polymers, the content of the anionic water-soluble polymer means the total amount of them.

[Dispersing Medium]

The polishing composition contains a dispersing medium (solvent) for dispersion of each component constituting the polishing composition. The dispersing medium has a function of dispersing or dissolving each component. Examples of the dispersing medium include an organic solvent and water, and the dispersing medium preferably contains water, and is more preferably water.

As the dispersing medium, water which does not contain impurities as much as possible is preferable from the viewpoint of suppressing the contamination of the object to be polished and inhibition of the actions of other components. As such water, for example, water having a total content of transition metal ions of 100 ppb or less is preferable. Here, the purity of water can be increased by operations of removal of impurity ions using an ion exchange resin, removal of foreign matters through a filter, distillation, and the like, for example. Specifically, as water, for example, deionized water (ion-exchanged water), pure water, ultrapure water, distilled water, or the like is preferably used. Usually, 90% by volume or more of the dispersing medium contained in the polishing composition is preferably water, 95% by volume or more is more preferably water, and 99% by volume or more is still more preferably water, and 100% by volume is particularly preferably water.

Further, the dispersing medium may be a mixed solvent of water and an organic solvent for dispersion or dissolution of each component. In this case, examples of the organic solvent to be used include acetone, acetonitrile, ethanol, methanol, isopropanol, glycerin, ethylene glycol, propylene glycol and the like, which are organic solvents that are mixed with water. Alternatively, these organic solvents may be used without being mixed with water to disperse or dissolve each component and then be mixed with water. The organic solvents may be used either singly or in combination of two or more types.

[Other Additives]

The polishing composition of the present invention may further contain, as long as the effects of the present invention are not impaired, known additives such as a pH adjusting agent, a chelating agent, a thickener, an oxidizing agent, a dispersant, a surface protectant, a wetting agent, a surfactant, a rust preventive, an antiseptic agent, and an antifungal agent. The content of the additive may be appropriately set according to the purpose of the addition.

(pH Adjusting Agent)

The polishing composition of the present invention can adjust the pH within a desired range with a basic inorganic compound, but may further contains a pH adjusting agent other than the basic inorganic compound.

As the pH adjusting agent, known acids, bases other than the basic inorganic compounds, or salts thereof can be used. Specific examples of the acid that can be used as the pH adjusting agent include inorganic acids such as hydrochloric acid, sulfuric acid, nitric acid, hydrofluoric acid, boric acid, carbonic acid, hypophosphite, phosphite, and phosphoric acid; and organic acids such as formic acid, acetic acid, propionic acid, butyric acid, valeric acid, 2-methyl butyric acid, n-hexanoic acid, 3,3-dimethyl butyric acid, 2-ethyl butyric acid, 4-methyl pentanoic acid, n-heptanoic acid, 2-methyl hexanoic acid, n-octanoic acid, 2-ethyl hexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furandicarboxylic acid, 2,5-furandicarboxylic acid, 3-furancarboxylic acid, 2-tetrahydrofurancarboxylic acid, methoxyacetic acid, methoxyphenylacetic acid, and phenoxyacetic acid.

Examples of the base other than the basic inorganic compound that can be used as the pH adjusting agent include basic organic compounds such as aliphatic amines such as ethanolamine and 2-amino-2-ethyl-1,3-propanediol, aromatic amines, and tetraammonium hydroxide, for example. Ammonia can also be used as a pH adjusting agent.

The pH adjusting agents may be used either singly or in combination of two or more types. The addition amount of the pH adjusting agent is not particularly limited, and may be appropriately adjusted so that the polishing composition is within a desired range.

The lower limit of the pH of the polishing composition is not particularly limited, and is preferably 9.5 or more, more preferably 10 or more, still more preferably 10.5 or more, and particularly preferably 11 or more. With such a lower limit, the polishing speed of the object to be polished can be improved. Further, the upper limit of the pH is not particularly limited, but is preferably 13 or lower, more preferably 12.5 or lower, and still more preferably 12 or lower. With such a lower limit, the stability of the polishing composition can be improved.

Note that, the pH of the polishing composition can be measured by, for example, a pH meter.

<Method for Producing Polishing Composition>

The method for producing the polishing composition of the present invention is not particularly limited, and for example, the polishing composition can be obtained by stirring and mixing abrasive grains, a basic inorganic compound, an anionic water-soluble polymer, and if necessary, other additives in a dispersing medium. The details of each component are as described above. Therefore, the present invention provides a method for producing a polishing composition, which includes mixing abrasive grains, a basic inorganic compound, an anionic water-soluble polymer, and a dispersing medium.

The temperature at which each component is mixed is not particularly limited, and is preferably 10° C. or more and 40° C. or less, and heating may be performed to increase a rate of dissolution. In addition, a mixing time is also not particularly limited as long as uniform mixing is possible.

<Polishing Method and Producing Method of Semiconductor Substrate>

The present invention provides a polishing method including a step of polishing an object to be polished using the polishing composition according to the embodiment of the present invention. The present invention also provides a method for producing a semiconductor substrate, which includes the above polishing method.

As a polishing apparatus, it is possible to use a general polishing apparatus to which a holder for holding a substrate or the like having an object to be polished and a motor or the like capable of changing the rotation speed are attached, and which includes a platen to which a polishing pad (polishing cloth) can be attached.

As the polishing pad, general non-woven fabric, polyurethane, porous fluororesin and the like can be used without particular limitation. It is preferable that the polishing pad is subjected to groove processing so that a polishing solution is accumulated.

Regarding the polishing conditions, for example, the rotation speed of the platen is preferably 10 rpm (0.17 $s^{-1}$) or more and 500 rpm (8.3 $s^{-1}$) or less. The pressure (polishing pressure) applied to the substrate having the object to be polished is preferably 0.5 psi (3.4 kPa) or more and 10 psi (68.9 kPa) or less. The method for supplying the polishing composition to the polishing pad is not particularly limited, and for example, a method for continuously supplying the composition with a pump or the like is employed. The amount supplied is not particularly limited, the surface of the polishing pad is preferably covered with the polishing composition of the present invention all the time.

After completion of the polishing, the substrate is washed in flowing water, and water droplets adhering to the substrate are removed by a spin dryer or the like to dry the substrate, thereby obtaining a substrate having a metal-containing layer.

The polishing composition of the present invention may be a one-component type or a multi-component type including a two-component type. In addition, the polishing composition of the present invention may be prepared by diluting, for example, 10 times or more of the stock solution of the polishing composition with a diluent such as water.

Although the embodiments of the present invention have been described in detail, note that this is illustrative and exemplary, and not limiting, and the scope of the present invention is to be interpreted by the appended claims.

The present invention includes the following aspects and embodiments.

1. A polishing composition containing abrasive grains; a basic inorganic compound; an anionic water-soluble polymer; and a dispersing medium, wherein a zeta potential of the abrasive grains is negative, an aspect ratio of the abrasive grains is 1.1 or less, in a particle size distribution of the abrasive grains obtained by a laser diffraction/scattering method, a ratio D90/D50 of a particle diameter D90 when an integrated particle mass reaches 90% of a total particle mass from a fine particle side to a particle diameter D50 when the integrated particle mass reaches 50% of the total particle mass from the fine particle side is more than 1.3, and the basic inorganic compound is an alkali metal salt.

2. The polishing composition according to 1. above, wherein the anionic water-soluble polymer is at least one selected from the group consisting of a polyacrylic acid-based polymer and a polymethacrylic acid-based polymer.

3. The polishing composition according to 1. or 2. above, wherein a molecular weight of the anionic water-soluble polymer is 5,000 or more and 6,000,000 or less.

4. The polishing composition according to any one of 1. to 3. above, which a pH is 9.5 or higher.

5. The polishing composition according to any one of 1. to 4. above, wherein the abrasive grains contain alumina.

6. The polishing composition according to 5. above, wherein the alumina contains a γ phase as a crystal phase.

7. The polishing composition according to 5. or 6. above, wherein a pregelatinization rate of the alumina is less than 50%.

8. The polishing composition according to any one of 5. to 7. above, wherein a fracture strength of the alumina is 0.5 GPa or more.

9. A polishing method including polishing an object to be polished using the polishing composition according to any one of 1. to 8. above.

10. A method for producing a semiconductor substrate, which includes the polishing method according to 9. above.

EXAMPLES

The present invention will be further described in detail using the following examples and comparative examples.

Here, the technical scope of the present invention is not limited to the following examples. In addition, unless otherwise specified, "%" and "parts" mean "% by mass" and "parts by mass", respectively. Further, in the following examples, unless otherwise specified, the operation was performed under the conditions of room temperature (20° C. to 25° C.)/relative humidity 40% RH to 50% RH.

[Preparation of Abrasive Grains]

(Alumina by Vaporized Metal Combustion Method: Production of Abrasive Grains A)

Abrasive grains A were prepared by a vaporized metal combustion method with reference to the examples of JP 60-255602 A. Note that, in the following description, the abrasive grains A produced by the vaporized metal combustion method may be referred to as "VMC alumina". The physical properties of the obtained abrasive grains A (VMC alumina) were calculated according to the following measurement method and are shown in Table 1 below.

(Sintered and Crushed α-Alumina: Production of abrasive grains B)

Sintered pulverized α-alumina was prepared as abrasive grains B. Specifically, as described in paragraph "0013" of JP 2006-36864 A, after performing calcination under the conditions in which the calcination temperature of aluminum hydroxide was in a range of 1100° C. to 1500° C., and the calcination time was in a range of 1 to 5 hours, the resultant was pulverized using an aluminum oxide pole having a diameter of 20,000 μm. Powdery sintered pulverized α-alumina was produced as the abrasive grains B by a method for producing alumina (crushing method) by calcining in this way and then pulverizing if necessary. In the production of the abrasive grains B, the crushing time was controlled so that the average particle size values indicated in Table below were able to be obtained. The physical properties of the obtained abrasive grains B (sintered pulverized α-alumina) were calculated according to the following measurement method and are shown in Table 1 below.

[Analysis of Type and Content of Crystal Phase]

(Type of Crystal Phase Contained in Alumina)

Regarding the powdered abrasive grains (alumina), a powder X-ray diffraction spectrum was obtained using a powder X-ray diffractometer (fully automatic multipurpose X-ray diffractometer SmartLab manufactured by Rigaku Corporation.), and the type of crystal phase contained in alumina was determined from the peak position of the powder X-ray diffraction spectrum. In the present specification, in a case where the peak of the α phase (012) plane appearing at a position of 2θ=25.6° was confirmed in the powder X-ray diffraction spectrum, it was determined that the alumina "contains the α phase as the crystal phase". In addition, the peak of the γ phase appearing at a position of 2θ=46° was confirmed, it was determined that the alumina "contains the γ phase as the crystal phase".

(Pregelatinization Rate) The pregelatinization rate [%] can be calculated by the following equation, from a peak height (I25.6) of an a phase (012) plane appearing at the position of 2θ=25.6° and a peak height (I46) of a γ phase appearing at the position of 2θ=46° in a powder X-ray diffraction spectrum obtained by using a powder X-ray diffractometer.

$$\text{Pregelatinization rate}=I25.6/(I25.6+I46)\times 100[\text{unit:}\%] \quad \text{[Equation 4]}$$

(Main Crystal Phase)

In a case where the pregelatinization rate was more than 50%, it was determined that alumina particles "contain the α phase as the main crystal phase". Further, a value calculated by the following equation, from a peak height (I25.6) of an a phase (012) plane appearing at the position of 2θ=25.6° and a peak height (I46) of a γ phase appearing at the position of 2θ=46° in a powder X-ray diffraction spectrum obtained by using a powder X-ray diffractometer, is defined as the austenitizing rate [%]. In a case where the austenitizing rate was more than 50%, it was determined that alumina particles "contain the γ phase as the main crystal phase".

$$\text{Austenitizing rate}=I46/(I25.6+I46)\times 100[\text{unit:}\%] \quad \text{[Equation 5]}$$

[Aspect Ratio]

For powdered abrasive grains (alumina), the aspect ratio was calculated by randomly selecting 100 abrasive grains from the images measured by a scanning electron microscope (SEM) (product name: SU8000 manufactured by Hitachi High-Technology Co., Ltd.) and measuring and calculating their average major axis and average minor axis. Subsequently, the aspect ratio of the abrasive grains was calculated according to the following equation using the values of the average major axis and the average minor axis.

$$\text{Aspect ratio}=\text{average major axis [μm]}/\text{average minor axis [μm]} \quad \text{[Equation 6]}$$

[Average Secondary Particle Size]

The powdered abrasive grains (alumina) were measured using a particle size distribution measuring apparatus (MicrotracBEL Corp., Microtrac MT3000II), and the average secondary particle size was evaluated.

[Fracture Strength]

For the powdered abrasive grains (alumina), a load-push displacement diagram was obtained by the following measuring apparatus and under the following measuring conditions. Then, the fracture strength of the abrasive grains was calculated according to the following equation, assuming that the point where the displacement increases rapidly is a point where large-scale fracture occurs in the particles.

$$S_t=(2.8\times P)/(\pi\times d^2) \quad \text{[Equation 7]}$$

in the equation, $S_t$ represents a fracture strength [GPa],

P represents a fracture load [kgf], and d represents an average particle size [μm] of particles.

(Measuring Apparatus and Measuring Conditions)

Measuring apparatus: Microcompression tester MCTW-500 manufactured by Shimadzu Corporation, Indenter used: Diamond flat indenter (φ=50 μm), Load speed: 7.747 mN/s: Constant load speed method, and Measurement atmosphere: Room temperature in the atmosphere.

Table 1 indicates the characteristics (material and producing method) of each abrasive grain and the evaluation results of a pregelatinization rate, a main crystal phase, an average particle size, an aspect ratio, an average major axis, an average minor axis, and a fracture strength.

Note that, in Table 1 below, the pregelatinization rate of <40 [%] means that although the α phase is included as the crystal phase, the value of the pregelatinization rate is more than 0% and less than 40%, and the pregelatinization rate of >70 [%] means that an a phase is included as the crystal phase, and the value of the pregelatinization rate is more than 70%.

TABLE 1

| Abrasive grain | Production method | Pregelatinization rate [%] | Main crystal phase | Average secondary particle size [μm] | Aspect ratio | Average major axis [μm] | Average minor axis [μm] | Fracture strength [GPa] |
|---|---|---|---|---|---|---|---|---|
| A (Alumina) | Vaporized metal combustion method (VMC) | <40 | γ | 0.2 | 1.01 | 0.201 | 0.2 | 0.78 |
| B (Alumina) | Sintering-crushing method | >70 | α | 1.3 | 1.6 | 1 | 0.620 | 0.42 |

[Preparation of Polishing Composition]

Example 1

Abrasive grains A (average primary particle size of 100 nm, average secondary particle size of 200 nm, and average association degree 2) obtained above as abrasive grains, polyacrylic acid (PAA) with a molecular weight (mass average molecular weight) of 1,000,000 as a water-soluble polymer, and potassium hydroxide as a basic compound and ion-exchanged water were stirred and mixed to reach the final concentration thereof, 1.0% by mass, 0.1% by mass, and 0.2% by mass, respectively, at room temperature (25° C.) for 30 minutes to prepare a polishing composition. A pH of the polishing composition measured by a pH meter (HORIBA, Ltd. Model No.: LAQUA (registered trademark)) was 12.0. Note that, the zeta potential of the abrasive grains A in the obtained polishing composition was −30 mV as measured by the following method. Table 2 indicates the results of the average primary particle size, the average secondary particle size, D90/D50, and the aspect ratio measured by the above method for the abrasive grains A in the obtained polishing composition.

Note that, the particle size of the abrasive grain A in the polishing composition was the same as the particle size of the powdered alumina in Table 1 above. Therefore, although powdered alumina was used as the measurement sample for the aspect ratio, the abrasive grains A in the polishing composition may be taken out and measured in the same manner.

In addition, "broad" in the particle size distribution column in Table 2 means that D90/D50 is more than 1.3, and "sharp" means that D90/D50 is 1.3 or less. Further, "spherical" in the particle shape column in Table 2 means that the aspect ratio is 1.1 or less, and "variant" means that the aspect ratio is more than 1.1. In Table 3, "PAA" represents polyacrylic acid, and "-" represents that the component is not contained.

Example 2 and Comparative Examples 1 to 3

The polishing compositions according to Example 2 and Comparative Examples 1 to 3 were prepared in the same manner as in Example 1 except that the type of the water-soluble polymer and the type of the basic compound were changed as indicated in Table 3 by using the abrasive grains shown in Table 2. Table 2 indicates the results of the zeta potential, the average primary particle size, the average secondary particle size, D90/D50, and the aspect ratio measured by the above method for the abrasive grains A in the obtained polishing composition. Note that, the particle size of the abrasive grain in the polishing composition was the same as the particle size of the powdered alumina in Table 1 above. The pH of the obtained polishing composition is indicated in Table 3 below.

<Evaluation>

[Zeta Potential Measurement]

Each polishing composition prepared below was put in ELS-Z2 manufactured by Otsuka Electronics Co., Ltd., to perform a measurement at temperature 25° C. using a flow cell by a laser Doppler method (electrophoretic light scattering measurement method). The zeta potential of the alumina in the polishing composition was calculated by analyzing the obtained data by the Smoluchowski equation.

[Measurement of Average Primary Particle Size]

The average primary particle size of the abrasive grains was calculated from the specific surface area of the abrasive grains measured by a BET method using "Flow SorbII 2300" manufactured by Micromeritics and the density of the abrasive grains. Further, the average secondary particle size of the abrasive grains was measured by a dynamic light scattering particle diameter and particle size distribution device UPA-UTI 151 manufactured by Nikkiso Co., Ltd.

[Measurement of Average Secondary Particle Size]

The average secondary particle size of the abrasive grains was measured by a light scattering method using a laser beam, and Microtrac MT3000II (manufactured by MicrotracBEL Corp) was used as a measuring machine. Note that, in the particle size distribution of the average secondary particle size of the abrasive grains, a ratio D90/D50 of a particle diameter D90 when an integrated particle mass reached 90% of a total particle mass from the fine particle side to a particle diameter D50 when the integrated particle mass reached 50% of the total particle mass from the fine particle side was calculated.

[Polishing Speed]

As an object to be polished, a silicon wafer (200 mm, blanket wafer, manufactured by Advantec Co., Ltd.) having a TEOS film with a thickness of 10000 Å on the surface and a silicon wafer (200 mm, blanket wafer, manufactured by Advantec Co., Ltd.) having a SiN film with a thickness of 3500 Å on the surface. A coupon obtained by cutting each silicon wafer into chips of 60 mm×60 mm was used as a test piece, and the substrate was polished under the following polishing conditions using each of the polishing compositions obtained above. The two types of objects to be polished were polished under the following conditions. Note that, the polishing speed of the SiN film was measured only in the polishing compositions of Example 1 and Comparative Example 1.

(Polishing Conditions)

TEOS Film

EJ-380IN-CH (manufactured by Engis Japan Corporation) was used as a polishing machine, and rigid polyurethane pad IC1000 (manufactured by Rohm and Haas Company) was used as a polishing pad. Polishing was carried out with a polishing time of 60 seconds under the conditions of a polishing pressure of 3.05 psi (21.0 kPa), a platen rotation speed of 60 rpm, a carrier rotation speed of 60 rpm, and a supply rate of the polishing composition of 100 ml/min.

SiN Film

EJ-380IN-CH (manufactured by Engis Japan Corporation) was used as a polishing machine, and rigid polyurethane pad IC1000 (manufactured by Rohm and Haas Company) was used as a polishing pad. Polishing was carried out with a polishing time of 60 seconds under the conditions of a polishing pressure of 4.0 psi (27.6 kPa), a platen rotation speed of 113 rpm, a carrier rotation speed of 107 rpm, and a supply rate of the polishing composition of 200 ml/min.

(Polishing Speed)

The polishing speed (Removal Rate; RR) was calculated by the following equation. Note that, 1 Å=0.1 nm is established.

$$\text{Polishing speed } [\text{Å/min}] = \frac{\text{film thickness before polishing } [\text{Å}] - \text{film thickness after polishing } [\text{Å}]}{\text{polishing time } [\text{min}]}$$

The film thickness was determined by light interference type film thickness measurement apparatus (Model No.: Lambda Ace VM-2030, manufactured by Dainippon Screen Mfg. Co., Ltd.), and the polishing speed was evaluated by dividing the difference between film thickness before and film thickness after polishing by the polishing time.

The evaluation results of the polishing speed for the TEOS film are indicated in Table 3 below.

The polishing speed for the SiN film was 376 Å/min when the polishing composition of Example 1 was used, and was 260 A/min when the polishing composition of Comparative Example 1 was used.

[Number of Scratches]

An object to be polished to be evaluated for the number of scratches was prepared. First, as an object to be polished, a silicon wafer (200 mm, blanket wafer, manufactured by Advantec Co., Ltd.) having a TEOS film with a thickness of 10000 Å on the surface and a silicon wafer (200 mm, blanket wafer, manufactured by Advantec Co., Ltd.) having a SiN film with a thickness of 3500 Å on the surface. These two types of objects to be polished were polished under the following polishing conditions using the polishing compositions of Example 1 and Comparative Example 4 obtained above.

(Polishing Conditions for Evaluating the Number of scratches)

Polishing apparatus: CMP single-sided polishing apparatus for 200 mm Mirra, manufactured by Applied Materials, Inc.

Pad: Nitta Haas Incorporated., Hard polyurethane pad IC1010

Polishing pressure: 2.0 psi

Platen rotation speed: 83 rpm

Carrier rotation speed: 77 rpm

Supply of polishing composition: Flowing

Supply amount of polishing composition: 200 ml/min

Polishing time: 60 sec

The number of scratches on the surface of the object to be polished after polishing was measured by measuring the coordinates of the entire surface (excluding the outer circumference of 2 mm) of both sides of the object to be polished using the wafer inspection apparatus "Surf scan (registered trademark) SP2" manufactured by KLA-Tencor Corporation, and then, observing all the measured coordinates with Review-SEM (RS-6000, manufactured by Hitachi High-Tech Corporation.). Note that, the scratches on the surface of the substrate having a depth of 10 nm or more and less than 100 nm, a width of 5 nm or more and less than 500 nm, and a length of 100 μm or more were counted as scratches, and scratch evaluation was performed according to the following criteria.

[Scratch Evaluation Criteria]

. . . The number of scratches is less than 10, which is good.

x . . . The number of scratches is 10 or more, which is defective.

As a result of counting the scratches, when the polishing composition of Example 1 was used, the scratch evaluation was o, and when the polishing composition of Comparative Example 3 was used, the scratch evaluation was x.

TABLE 2

| | Abrasive grain | | | | | | | | |
|---|---|---|---|---|---|---|---|---|---|
| | Abrasive grain | Production method | Zeta potential (mV) | Average primary particle (nm) | Average secondary particle (nm) | D90/D50 | Particle size distribution | Particle shape | Aspect ratio |
| Example 1 | A | VMC Alumina | −30 mV | 100 | 200 | 2.8 | Broad | Spherical | 1.01 |
| Example 2 | A | VMC Alumina | −30 mV | 100 | 200 | 2.8 | Broad | Spherical | 1.01 |
| Comparative Example 1 | A | VMC Alumina | −30 mV | 100 | 200 | 2.8 | Broad | Spherical | 1.01 |
| Comparative Example 2 | A | VMC Alumina | −30 mV | 100 | 200 | 2.8 | Broad | Spherical | 1.01 |
| Comparative Example 3 | B | Sintered crushed α-alumina | −30 mV | 700 | 1280 | 2.8 | Broad | Variant | 1.60 |

TABLE 3

| | Abrasive grain | | Basic compound | | Water-soluble polymer | | | | |
|---|---|---|---|---|---|---|---|---|---|
| | Types | Content (% by mass) | Types | Concentration [mass %] | Types | Molecular weight | Concentration [mass %] | pH | TEOS polishing speed (Å/min) |
| Example 1 | A | 1.0 | KOH | 0.2 | PAA | 1000000 | 0.1 | 12 | 745 |
| Example 2 | A | 1.0 | KOH | 0.2 | PAA | 100000 | 0.1 | 12 | 500 |
| Comparative Example 1 | A | 1.0 | KOH | 0.2 | — | — | — | 12 | 436 |
| Comparative Example 2 | A | 1.0 | Ammonia | 0.2 | PAA | 1000000 | 0.1 | 12 | 24 |
| Comparative Example 3 | B | 1.0 | KOH | 0.2 | PAA | 1000000 | 0.1 | 12 | 650 |

As indicated in Table 3, it was found that in a case where the polishing compositions of Examples 1 and 2 were used, the polishing speed with respect to the TEOS film exceeded 450 A/min, and the TEOS film was able to be polished at a high polishing speed as compared with the polishing compositions of Comparative Examples 1 and 2.

Further, it was found that the polishing composition of Comparative Example 3 had a high polishing speed with respect to the TEOS film, but scratches were easily formed. The reason for this is presumed that the scratches are more likely to be formed as a result of the suppression of rolling of irregularly shaped particles having an aspect ratio of more than 1.3 by the abrasive grains.

On the other hand, in the polishing composition of Example 1, the scratches are suppressed as compared with the polishing composition of Comparative Example 3. It is considered that this is a result of the characteristics such as the aspect ratio, particle size, particle size distribution, and hardness of the abrasive grains A used in the polishing composition of Example 1 acting on the polishing speed in a well-balanced manner.

Comparing Example 1 with Comparative Example 3, when the basic inorganic compound contained in the polishing composition is not an alkali metal salt, the polishing speed by the polishing composition is significantly reduced.

From this, it can be seen that the polishing speed of the object to be polished is improved when the polishing composition contains the basic inorganic compound which is an alkali metal salt and the anionic water-soluble polymer.

This application is based on Japanese Patent Application No. 2020-049621 filed on Mar. 19, 2020, the disclosure of which is incorporated herein by reference in entirety thereof.

What is claimed is:

1. A polishing composition comprising:

abrasive grains; a basic inorganic compound; an anionic water-soluble polymer; and a dispersing medium, wherein a zeta potential of the abrasive grains is negative, wherein the abrasive grains are alumina, wherein more than 50% of the alumina is in a γ-phase, an aspect ratio of the alumina is less than 1.1, in a particle size distribution of the abrasive grains obtained by a laser diffraction/scattering method, a ratio D90/D50 of a particle diameter D90 when an integrated particle mass reaches 90% of a total particle mass from a fine particle side to a particle diameter D50 when the integrated particle mass reaches 50% of the total particle mass from the fine particle side is more than 2.0, and the basic inorganic compound is an alkali metal salt.

2. The polishing composition according to claim 1, wherein the alumina is the spherical particles that are close to a true sphere for producing alumina by the vaporized metal combustion method.

3. The polishing composition according to claim 1, wherein the anionic water-soluble polymer is at least one selected from the group consisting of a polyacrylic acid-based polymer and a polymethacrylic acid-based polymer.

4. The polishing composition according to claim 3, wherein a molecular weight of the anionic water-soluble polymer is 5,000 or more and 6,000,000 or less.

5. The polishing composition according to claim 3, wherein a molecular weight of the anionic water-soluble polymer is 100,000 or more and 2,000,000 or less.

6. The polishing composition according to claim 5, wherein a content of the anionic water-soluble polymer is 0.01% by mass or more and 0.8% by mass or less.

7. The polishing composition according to claim 1, wherein the basic inorganic compound is potassium hydroxide.

8. The polishing composition according to claim 1, wherein a pH is 9.5 or higher and 13 or lower.

9. The polishing composition according to claim 1, the aspect ratio of the alumina is 1.08 or less.

10. The polishing composition according to claim 1, wherein the ratio D90/D50 is 2.5 or more.

11. The polishing composition according to claim 1, wherein the average secondary particle size of the alumina is 80 nm or more and 500 nm or less.

12. The polishing composition according to claim 1, wherein a pregelatinization rate of the alumina is less than 50%.

13. The polishing composition according to claim 1, wherein a fracture strength of the alumina is 0.5 GPa or more.

14. A polishing method comprising:

polishing an object to be polished using the polishing composition according to claim 1.

15. A method for producing a semiconductor substrate, comprising:

the polishing method according to claim 14.

16. A polishing composition consisting of:

abrasive grains; a basic inorganic compound; an anionic water-soluble polymer; and a dispersing medium; or abrasive grains; a basic inorganic compound; an anionic water-soluble polymer; a dispersing medium; and an additive, wherein a zeta potential of the abrasive grains is negative, wherein the abrasive grains are alumina, wherein more than 50% of the alumina is in a γ-phase, an aspect ratio of the alumina is less than 1.1, in a particle size distribution of the abrasive grains obtained by a laser diffraction/scattering method, a ratio D90/D50 of a particle diameter D90 when an integrated particle mass reaches 90% of a total particle mass from a fine particle side to a particle diameter D50 when the integrated particle mass reaches 50% of the total particle mass from the fine particle side is more than 2.0, wherein the basic inorganic compound is an alkali metal salt, wherein the anionic water-soluble polymer is at least one selected from the group consisting of polyacrylic acid-based polymer and a polymethacrylic acid-based polymer, and wherein the additive is one or more selected from the group consisting of a pH adjusting agent, a chelating agent, a thickener, an oxidizing agent, a dispersant, a surface protectant, a wetting agent, a surfactant, a rust preventative, an antiseptic agent, and an antifungal agent.

* * * * *